United States Patent [19]
Paoli et al.

[11] Patent Number: 5,438,584
[45] Date of Patent: Aug. 1, 1995

[54] DUAL POLARIZATION LASER DIODE WITH QUATERNARY MATERIAL SYSTEM

[75] Inventors: Thomas L. Paoli, Los Altos; David P. Bour, Cupertino, both of Calif.

[73] Assignee: Xerox Corporation, Stamford, Conn.

[21] Appl. No.: 173,812

[22] Filed: Dec. 23, 1993

Related U.S. Application Data

[63] Continuation-in-part of Ser. No. 948,524, Sep. 22, 1992, Pat. No. 5,396,508, and a continuation-in-part of Ser. No. 948,522, Sep. 22, 1992, Pat. No. 5,412,678.

[51] Int. Cl.$^6$ ............................................. H01S 3/103
[52] U.S. Cl. ............................................. 372/45
[58] Field of Search ................. 372/43, 45, 96, 50, 372/106

[56] References Cited

FOREIGN PATENT DOCUMENTS 52-18592  8/1993  Japan .

OTHER PUBLICATIONS

R. L. Moon, G. A. Antypas, and L. W. James, Journal of Eectronic Materials 3, 635 (1974). (no month available).

H. C. Casey, Jr. and M. B. Panish, Heterostructure Lasers Part B: Materials and Operating Characteristics, pp. 14–17, 22–23, Academic Press, Orlando, Fla. 1978. (no month available).

M. J. B. Boermans et al. Investigation of TE and TM polarised laser emission in GaInP/AlGaInP lasers by growth–controlled strain, Electronics Letters 26, 1438 (1990) August.

Primary Examiner—Rodney B. Bovernick
Assistant Examiner—Robert McNutt
Attorney, Agent, or Firm—Rosen, Dainow & Jacobs

[57] ABSTRACT

A semiconductor laser source using a strained active layer of GaAsP or InGaAsP or AlGaAsP to obtain semiconductor laser sources that emit TM-polarized light in the wavelength range of 600–870 nm. Preferably, the active layer is flanked by confining layers of AlGaAs or $(AlGa)_{0.52}In_{0.48}P$. The active layer under proper conditions can also emit TE-polarized light. Hence, arrays of side-by-side orthoginally-polarized emitters, or switchable polarized emitters are feasible.

27 Claims, 4 Drawing Sheets

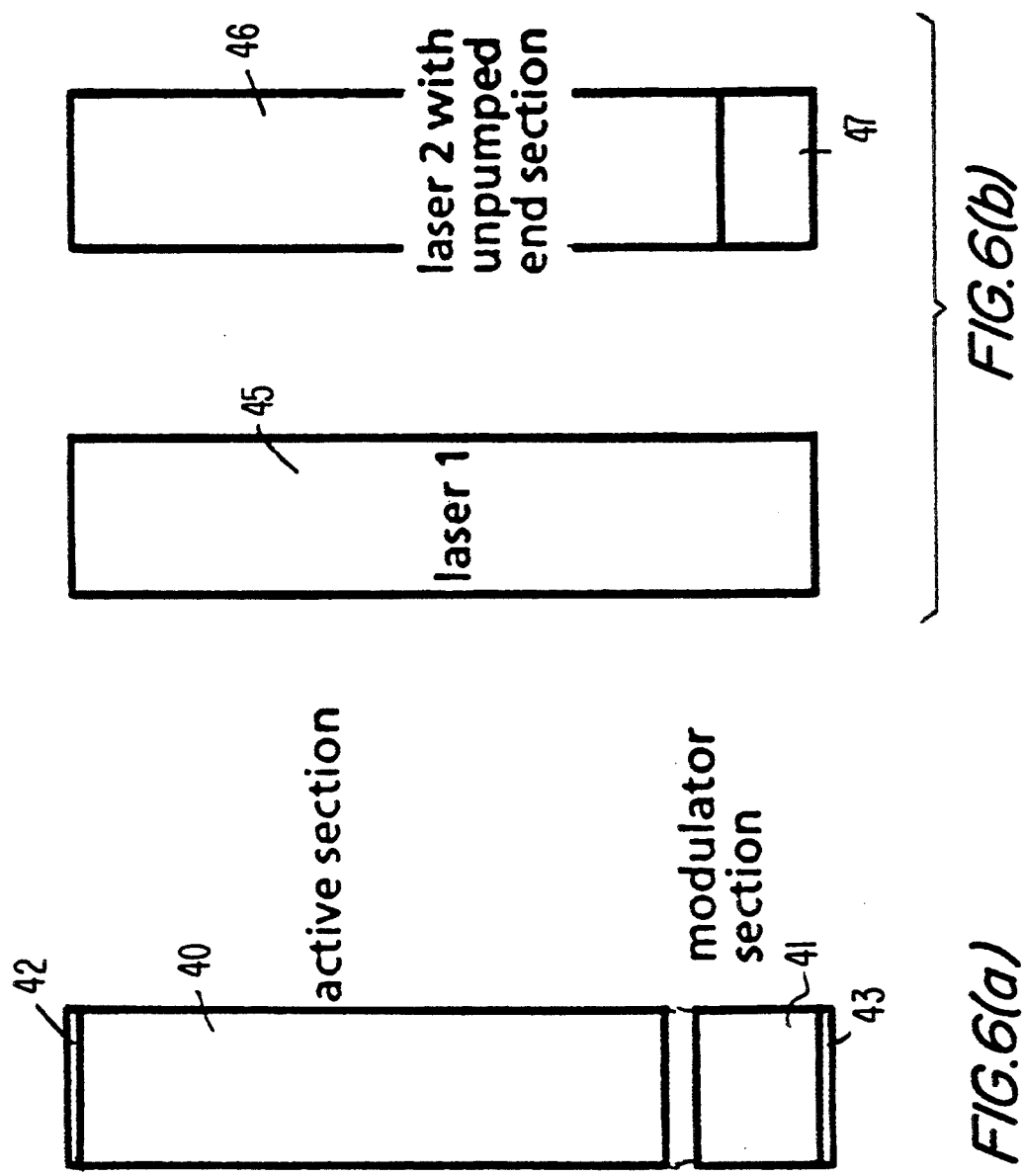

DUAL POLARIZATION LASER DIODE WITH QUATERNARY MATERIAL SYSTEM

RELATED APPLICATIONS (1) Commonly-assigned, prior filed application, Ser. No. 07/948,524, filed Sep. 22, 1992, now U.S. Pat. No. 5,396,508, entitled MULTI-BEAM, ORTHOGONALLY-POLARIZED EMITTING MONOLITHIC QUANTUM WELL LASERS, in the names of D. W. Treat, D. P. Bour and T. L. Paoli, of which the present application is a continuation-in-part.

(2) Commonly-assigned, prior filed application, Ser. No. 07/948,522, filed Sep. 22, 1992, now U.S. Pat. No. 5,412,678, entitled POLARIZATION SWITCHABLE QUANTUM WELL LASER, in the names of D. W. Treat, D. P. Bour, and T. L. Paoli, of which the present application is a continuation-in-part.

(3) Commonly-assigned application, Ser. No. 08/146,758, filed Nov. 2, 1993, entitled TM-POLARIZED LASER EMITTER USING III–V ALLOY WITH NITROGEN, in the names of C. Van de Walle and D. P. Bour.

BACKGROUND OF THE INVENTION

The above-referenced related applications, Ser. Nos. 07/948,524 and 07/948,522, whose contents are herein incorporated by reference, describe the construction and method of manufacture on a common substrate of individually addressable quantum well (QW) lasers that can be caused to oscillate in the transverse electric (TE) or in the transverse magnetic (TM) mode, and QW laser constructions that can be switched from oscillating in the TE polarization mode to the TM polarization mode, or vice versa. This has been accomplished in certain material systems by controlling the type of strain induced in the epitaxially deposited active region due to lattice mismatches with the substrate. Thus, in most material systems allowing heavy hole and light hole transition, when the $N=1$ heavy hole is the lowest energy state and therefore the state whose population is most easily inverted, usually true for unstrained and compressively strained III–V alloy systems, TE polarization gain will predominate. However, by reversing the light hole and heavy hole band edges, achieved in certain material systems by inducing tensile strain into the active region, TM polarization gain will predominate. In the degenerate condition, where the light hole and heavy hole bands are substantially coincident in energy, the polarization of the emission can be determined by threshold carrier density and other factors, such as temperature, facet reflectivity, cavity length and intracavity optical loss.

In general, the desired polarization mode emitter can be achieved with either a single QW, carefully adjusted, or separate QWs for TE and TM mode gain, respectively, with the polarization mode of laser oscillation dependent upon the modal gain characteristics and the threshold gain. The necessary gain characteristic has one polarization with lowest transparency current, and the orthogonal polarization with a greater peak gain. For some range of active region parameters (thickness, composition, placement within the confining region, etc.), these characteristics can be obtained, and so the polarization will be determined by the threshold gain. Therefore, the polarization of each device can be selected, for example by introducing an additional loss into one of the devices, thereby forcing it to oscillate in the higher-gain polarization. On the other hand, a device without this additional loss will simply oscillate in the polarization which has lowest transparency current. The additional loss could be provided by an unpumped section along the cavity, low mirror reflectivity, shorter cavity, etc. Similarly, the polarization of each device could be switched, by using an intracavity loss modulator.

This polarization selectivity mechanism is demonstrated by the polarization-dependent gain-current characteristics shown in FIG. 1, in which modal gain, g, for both TM and TE modes is plotted along the ordinate, and current, I, for both modes is plotted along the abscissa. The curve 10 labelled TE shows the gain characteristic for the TE-mode, and the curve 11 labelled TM that for the TM-mode. When the operating conditions are represented by the vertical line 13, to the left of the crossover 14, then the TE-gain is higher and TE-polarized light is emitted. When the operating conditions are represented by the vertical line 15, to the right of the crossover 14, then the TM-gain is higher and TM-polarized light is emitted.

Applying the principles described above to the material systems disclosed in the referenced prior applications resulted in laser devices that could emit in the spectral range of about 600–650 nm. However, there are important applications for laser devices that emit significantly beyond the 650 nm limit.

SUMMARY OF THE INVENTION

An object of the invention is a solid-state, monolithic laser with side-by-side orthogonally polarized QW lasers capable of operation over a wider wavelength range.

A further object of the invention is a solid-state QW laser switchable between TE and TM polarization modes over a wider wavelength range.

Another object of the invention is a TM-mode semiconductor laser for the wavelength range 600–850 nm.

We have found that a reason for the limited wavelength range of the controllable TE/TM QW lasers described in the first two prior-filed related applications is the limited alloy range over which the threshold determining the TM mode of operation can be brought close enough to that determining the TE mode of operation by means of tensile strain inducement so that control of the polarization mode of operation is possible.

We have further found that there exist certain material systems which do not exhibit this limitation, with the result that QW lasers can be fabricated that are capable of operating in either the TE or TM mode substantially beyond 650 nm.

In particular, we have found that using certain strained ternary and preferably certain strained quaternary systems as the active layer would expand long wavelength operation with controllable or switchable polarization out to about 850 nm. This offers important advantages for certain applications, such as polarization controlled, multi-beam raster output scanning (ROS) color printing, where it is desirable to have individually addressable arrays of orthogonally polarized lasers or polarization switchable lasers in the 600–850 nm wavelength range, especially fabricated on GaAs substrate.

In accordance with a feature of this invention, the quaternary system preferably comprises $In_{1-x}Ga_xAs_yP_{1-y}$ or $Al_{1-x}Ga_xAs_yP_{1-y}$.

The above and further objects, details and advantages of the present invention will become apparent from the following detailed description of preferred embodiments thereof, when read in conjunction with the accompanying drawings.

SUMMARY OF DRAWINGS

In the drawings:

FIG. 6 schematically illustrates at (a) a laser with a modulator section for polarization switching, (b) side-by-side lasers of fixed polarization.

DETAILED DESCRIPTION OF PREFERRED EMBODIMENT

Figure 2:
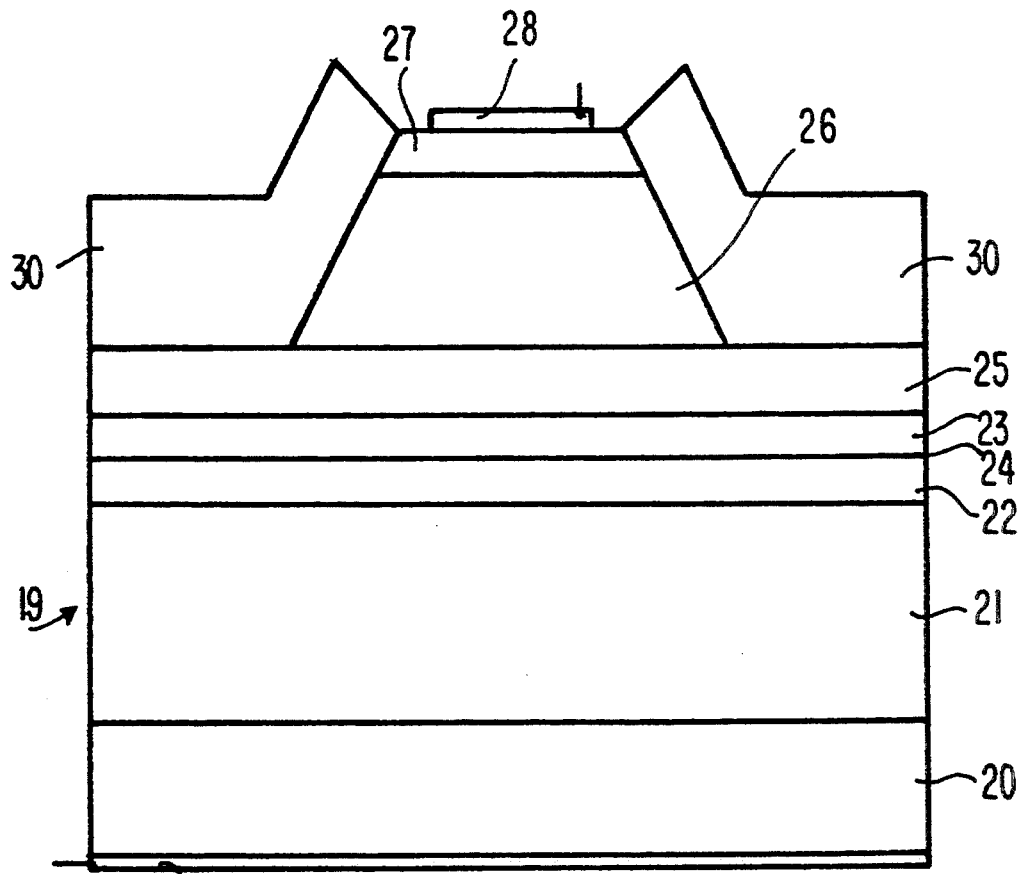
FIG. 2 is a schematic view of one form of laser diode in accordance with the invention.

FIG. 2 shows schematically the geometry of a conventional III–V alloy selectively buried ridge waveguide diode laser 19 comprising a substrate 20 on which are spitaxially grown in the conventional manner cladding layers 21, 25, 26 optical and carrier confining regions 22, 23 flanking an active QW layer 24, ridge or mesa cap layers 26, and contact layer 27. Electrodes 28, 29 at top and bottom provide the injection current for the active layer 24. The layers 30 flanking the ridge 26 are typically regrown. Not shown are the usual reflecting facets forming the optical cavity at opposite ends of the structure.

In a preferred embodiment, the substrate 20 is of GaAs, the cladding and confining layers 21, 22, 23, 25 and 26 of AlGaAs, and the regrown layers 30 of GaAs.

In accordance with the invention, a $In_{1-x}Ga_xAs_yP_{1-y}$ or $Al_{1-x}Ga_xAs_yP_{1-y}$ quaternary alloy active region 24 is used in the semiconductor laser, with either AlGaAs or $(AlGa)_{0.5}In_{0.5}P$ as the confining structure 22, 23, plus 21, 25, and 26 lattice matched to the GaAs substrate 20.

Figure 3:
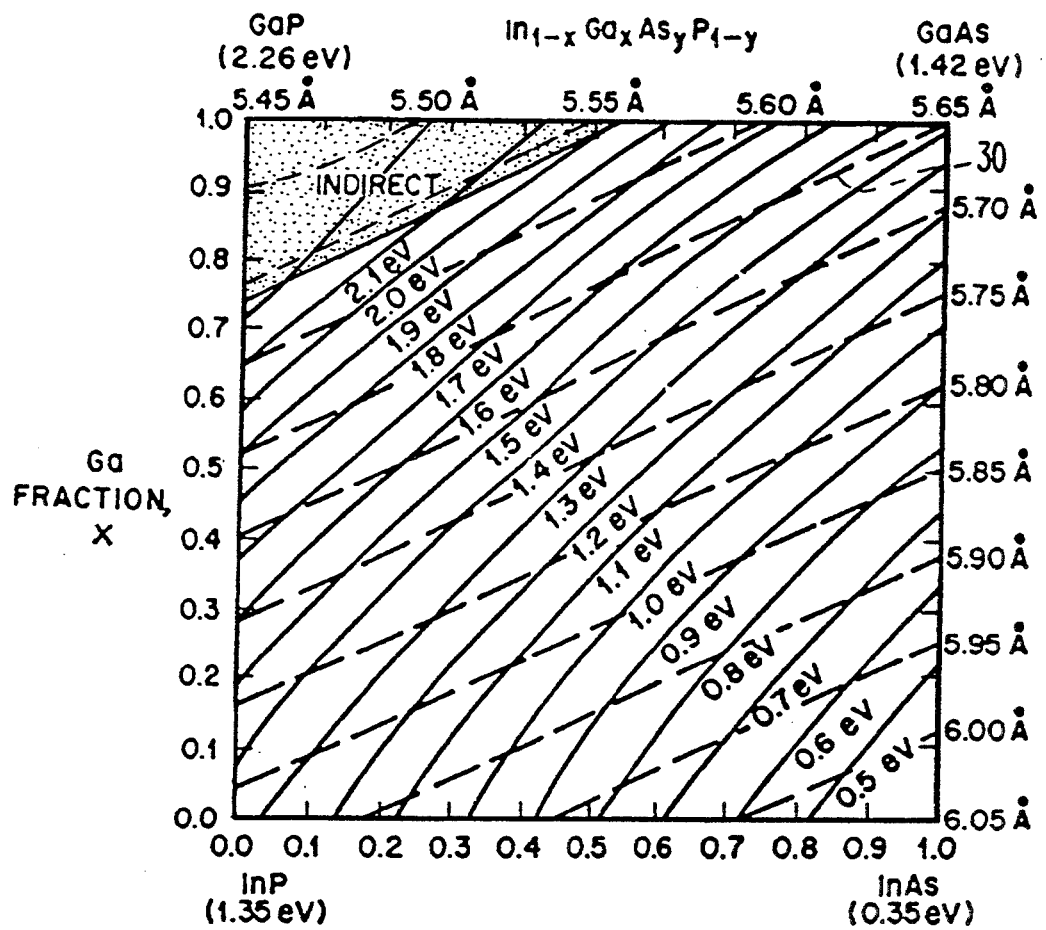
FIG. 3 is a graph showing the composition dependence of unstrained bandgap energies and lattice parameters for $In_{1-x}Ga_xAs_yP_{1-y}$.

First considering the $In_{1-x}Ga_xAs_yP_{1-y}$ alloy, for a lattice matched InGaAsP active region, a wavelength range of 650 nm ($Ga_{0.156}In_{0.484}P$) to 870 nm (GaAs) is possible. This is shown in FIG. 3 taken from R. L. Moon et al., *Journal of Electronic Materials*, 3,635 (1974), which gives contours of constant bandgap energy (solid curves) and lattice constants (dashed lines), on axes of arsenic content (y) and gallium content (x). Due to bandgap bowing with composition, the bandgap contours are curved; in contrast, Vegard's law is assumed for the composition-dependent lattice parameter, so these contours are straight. The condition of lattice match to GaAs is along the dashed line $a_o=5.65Å$, designated 30, which runs from y=0, x=0.516 to the top right-hand corner (x,y=1). Hence, any InGaAsP quaternary alloy active region having a composition falling substantially along the dashed line 30 would be lattice matched to GaAs and could span the bandgap region of approximately 1.4–1.9 eV, equivalent to laser emission at 650–870 nm. When y=0, at the left endpoint of the curve 30, a ternary alloy $In_{0.484}Ga_{0.516}P$ is included among the lattice-matched alloys.

Likewise, the quaternary alloy $Al_{1-x}Ga_xAs_yP_{1-y}$ may also be employed in active regions spanning a similar bandgap range. This is demonstrated in FIG. 4, with the bandgap energy and lattice parameter contours for the AlGaAsP quaternary taken from H. C. Casey, Jr. et al., "*Heterostructure Lasers, Part B: Materials and Operating Characteristics*", Academic Press, Orlando, FL, 1978. Comparing to FIG. 3, the indium group-III constituent is simply replaced with aluminum, and since the AlAs/GaAs and AlP/GaP binaries are very closely lattice matched, the lattice parameter contours (dashed lines), are nearly vertical. The contour representing lattice match to GaAs extends from y=0.97, x=0 ($AlAs_{0.97}P_{0.03}$) to y=1, x=1 (GaAs), and is designated 32.

Compositions lying on the left-hand side of this contour 32 have smaller lattice parameters, and so will be tensile strained when grown on AlGaAs or $(AlGa)_{0.5}In_{0.5}P$. Lattice matched $Al_{1-x}Ga_xAs_yP_{1-y}$ alloys have a direct bandgap $1.424<E_r<2.0$ eV, corresponding to a wavelength range 620 nm to 870 nm.

As explained in the referenced related applications, a laser device with a lattice-matched, quantum well active region will oscillate in the TE-mode, because the fundamental electronic transition terminates on the heavy-hole energy level. By introducing (biaxial) tensile strain, however, the laser can be made to oscillate in the TM-mode. This is accomplished through intentionally lattice-mismatching the active region toward tension. As a result, the heavy- and light-hole energy levels can switch position, with the light hole level becoming the ground state in the valence band. In this case, it is the light hole population which becomes inverted at a lower injected carrier density. Therefore, since the light-hole transition provides gain for the TM-mode, the TM-mode polarization can be made to oscillate in such a structure.

As a simple illustration of the above explanation, consider the $In_{1-x}Ga_xAs_yP_{1-y}$ or $Al_{1-x}Ga_xAs_yP_{1-y}$ quaternary alloys, where x=1. The result is a GaAsP ternary alloy, lying on the top axes of FIGS. 3 and 4. For a device with AlGaAs or $(AlGa)_{0.5}In_{0.5}P$ confining regions, the lattice-matched active region is GaAs. By alloying a GaAs active region with phosphorus, the lattice parameter becomes smaller and the active region quantum well undergoes biaxial tension. There exists a composition (strain)-dependent critical thickness, below which the quantum well is pseudomorphic and free of interfacial misfit dislocations. The valence band structure of such an elastically deformed material is severely distorted, such that the light-hole band becomes the ground state, thereby enabling TM-mode laser oscillation.

In a 100 Å, lattice-matched QW, the light- and heavy-hole bands are separated by only about 10 meV. Since the valence bands shift rapidly with biaxial tension, only a few percent of phosphorus is required to invert the valence bands, as required for achieving TM-mode oscillation. Indeed, because such small strains ($\{\Delta a/a\}_\perp < 10^{-3}$) are sufficient, this technique could also be applied to thicker active regions, for example TM-mode double heterostructure (DH) lasers based on these materials. This has already been demonstrated for slightly-strained $GaInP/(AlGa)_{0.5}In_{0.5}P$ lasers. See *Electronics Letters*, 26,1438 (1990).

Using small amounts of phosphorus, it is thus possible to make TM-mode GaAsP lasers at a wavelength of about 850 nm, close to that of bulk GaAs. As the phosphorus content is increased, the bandgap energy and the biaxial tension also increase, so that the light-hole band continues to be the valence band ground state, and TM-mode oscillation is possible at shorter wavelengths. Keeping in mind that the QW thickness must remain subcritical (above which undesired dislocations are introduced), simply using the ternary alloy, GaAsP active regions will span a range of 650 nm to 870 nm.

Figure 4:
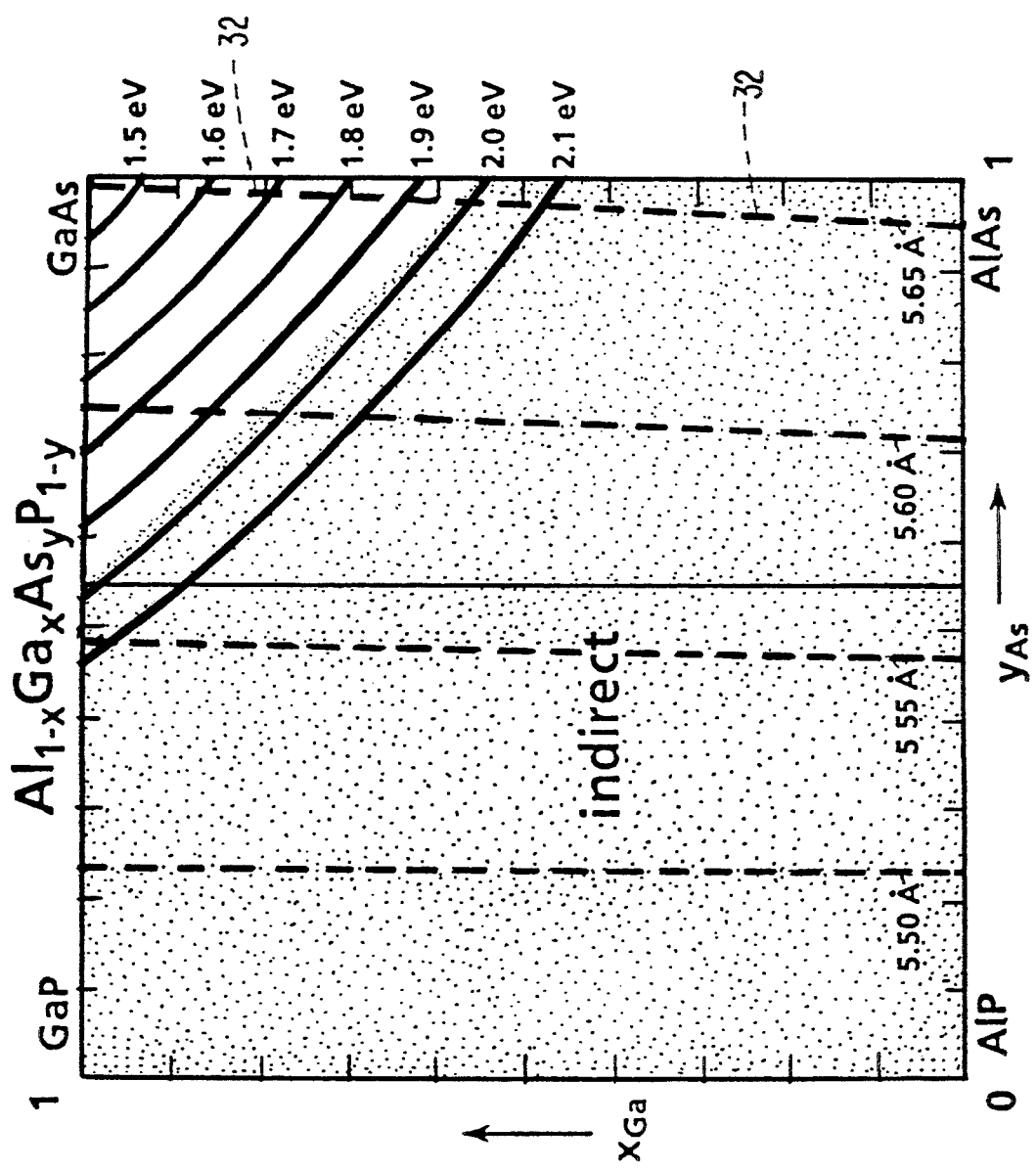
FIG. 4 is a graph similar to that of FIG. 3 for $Al_{1-x}Ga_xAs_yP_{1-y}$.

Thus, although the ternary alloy GaAsP resulting when $x=1$ in the above formulas accesses a very broad wavelength range, other considerations are also important, and, in general, a quaternary alloy, when $x<1$, offers more freedom in meeting all criteria. For instance, in order to avoid detrimental effects associated with proximity to the direct/indirect bandgap crossover, or to minimize the biaxial tension at a given wavelength, FIGS. 3 and 4 show how a quaternary InGaAsP or AlGaAsP alloy can be selected. For example, in FIG. 3, the area circumscribed by the points $(x,y)=(0.516,0)$; $(0.7,0)$; $(1,0.55)$; $(1,1)$ represents the preferred compositions to obtain suitably thin (10–1000Å) layers of InGaAsP for such active layers to lase in the TM-mode over the wavelength range of 600–860 nm. The preferred compositions (same thickness and wavelength ranges) for AlGaAsP are circumscribed by the points $(x,y)=(0.55, 0.98)$; $(1,1)$; $(1,0.55)$ in FIG. 4. Both alloy systems can be used to make TM-mode lasers from 650 nm to 850 nm, even by staying very close to the GaAs lattice match. With the InGaAsP material system, however, it is easier to avoid the indirect crossover, by using the GaInP ternary down to wavelengths of 600 nm.

It will be understood by those skilled in the art that direct bandgap transitions generate laser radiation more efficiently and thus the compositions falling in the areas labelled "INDIRECT" are to be avoided.

Figure 1:
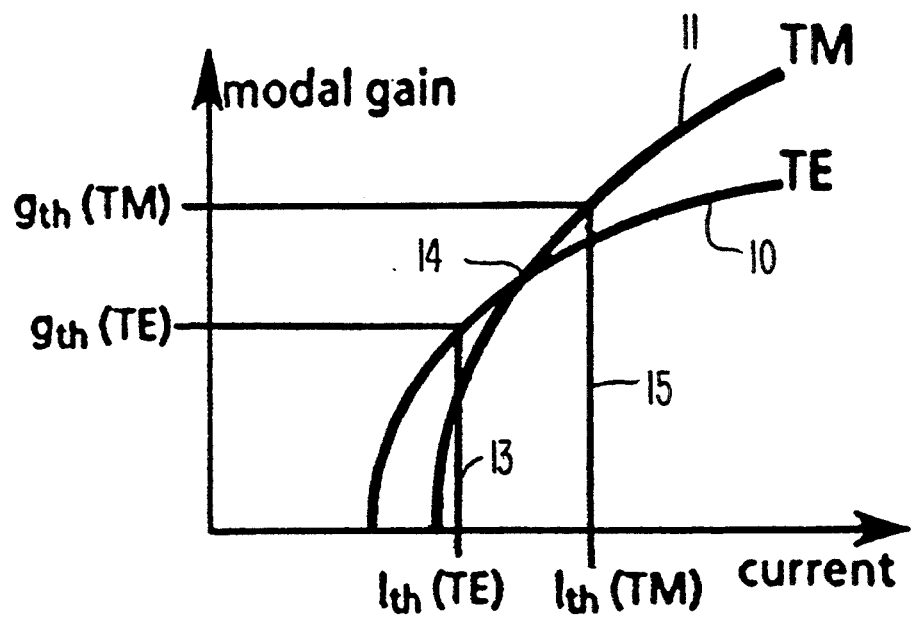
FIG. 1 is a graph of the gain-current characteristic of one form of laser diode in accordance with the invention.
Figure 5:
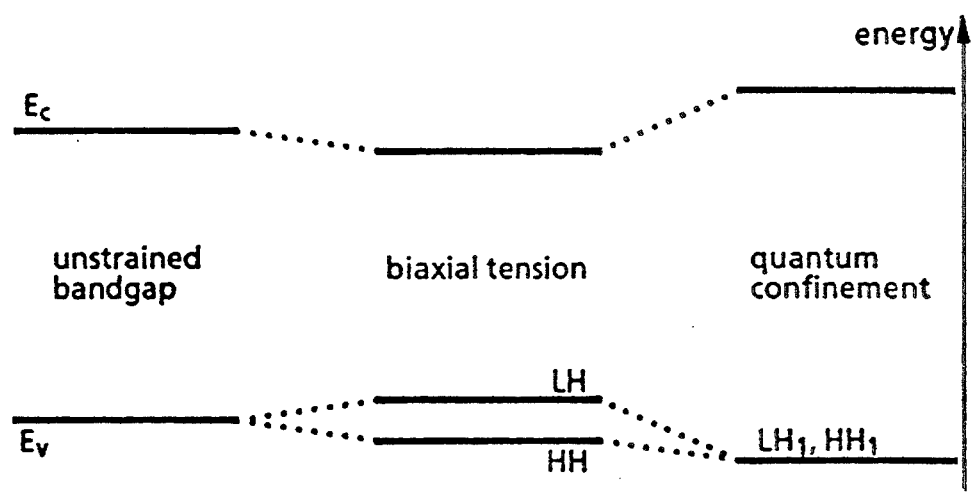
FIG. 5 is a schematic band diagram showing superposition of biaxial tension and quantum confinement, with quantum well thickness and composition exactly adjusted so that light- and heavy-hole band edges line up.

As described above, it is possible to tensile-strain the active region to achieve TM-mode polarization. Similarly, it is possible to design an active region structure where the quantum shifts are exactly balanced by the tensile strain effects, such that the light- and heavy-hole band edges virtually line up. This is shown schematically in FIG. 5, where, as usual in this art, for the band diagram shown, energy is plotted vertically, with Ec representing the conduction band edge and Ev the valence band edge, and LH and HH the light-hole and heavy-hole band edges, respectively. Three conditions are shown: for the unstrained active layers at the left; the effect of providing biaxial tension in the active layer at the center; and for the degenerate condition (after quantum shifts) at the right side. For a thick layer under biaxial tension, the light hole band edge lies above the heavy hole band edge. Since the quantum shifts are inversely proportional to the hole effective mass, however, the light hole band edge undergoes a greater quantum shift than the heavy hole. For some thickness (which depends upon the QW composition), as explained in the first and second referenced related applications, the two valence band edges become degenerate (at $k=0$). Of course, the maximum QW thickness is governed by the critical thickness for avoiding the formation of interfacial dislocations. The critical thickness thus depends upon the strain. As a practical matter, to obtain sufficient gain, the active layer should be at least 1 nm thick; however, a multiple QW active region can provide greater gain. As previously described in the related cases, in such a layer structure where $LH_1$ and $HH_1$ are nearly degenerate at $k=0$, the polarization of the oscillating mode will be a sensitive function of the device geometry (cavity length, modulator, etc.), temperature, and facet reflectivity. To achieve polarization switching in an exactly-adjusted single QW, the gain-current relationship must have certain characteristics. As shown in FIG. 1, the transparency current must be lowest in one polarization, curve 10, while the peak gain is greatest in the orthogonal polarization, curve 11. Therefore, one polarization, TE, has a lower threshold current, while the other (higher gain) polarization, TM, only oscillates if the threshold gain is increased. This can be achieved, for example, by including an intracavity loss modulator section in the device, as shown schematically in FIG. 6a and shown and described in more detail in the first two related applications. FIG. 6 schematically illustrates a top view of a laser crystal with an elongated active section 40 coupled to a modulator section 41. The lasing beam oscillates vertically between a reflecting face 42 at the top end and another reflecting facet 43 at the bottom end. Biasing means for the modulator section are not shown. Such a modulator section 41 is lossy when unpumped or biased below transparency, increasing the threshold gain enough that the high-gain polarization oscillates. In contrast, when the modulator is biased above transparency, the low-threshold polarization oscillates. Hence, by applying suitable bias potentials to the modulator section, the lasing action can be switched from the TM-mode to the TE-mode, and vice versa. Thus, the FIG. 6a embodiment schematically illustrates a laser with switchable polarization modes.

Similarly, as schematically illustrated in FIG. 6b, side-by-side lasers 45, 46 can be made to oscillate in fixed, orthogonal polarizations by having different cavity lengths, facet reflectivity, or inclusion of an unpumped absorbing section 47 as shown in FIG. 6b.

Alternatively, in order to achieve the necessary gain-current relationships with more degrees of freedom, multiple quantum wells can be used, with a separate QW(s) for gain in each polarization. For instance, at a given wavelength between 600 nm and 850 nm, it is possible to use an unstrained (or compressively strained) Qw(s) for TE-mode gain, and a tensile-strained QW(s) for TM-mode gain. This, and other alternatives, are described in more detail in the first and second related applications.

Quantum confinement and biaxial tension have opposite effects on the overall bandgap: while biaxial tension decreases the bandgap, quantum confinement increases the transition energy. Generally, the bandgap of a tensile-strained active region (smaller lattice parameter than GaAs) is higher than that of a lattice-matched alloy. As a rough estimate of the wavelengths available from the InGaAsP active region of the invention, we note from FIG. 3 the range of bandgap contours which cross the line GaAs lattice parameter: 2.0 ev ($Ga_{0.52}In_{0.48}P$, $\lambda=620$ nm) to 1.42 ev (GaAs, $\lambda=870$ nm). For a thick active region (either thick QW or even a thin double heterostructure), only slight biaxial tension is required to achieve TM-mode oscillation. See the Casey, Jr. et al. book and Electronics letters 26, 1438 (1990), earlier referenced. Therefore, due to the offsetting effects of biaxial tension and quantum confinement on the bandgap energy, along with the requirement of only slight strain ($\{\Delta a/a\}\perp <10^{-3}$), we estimate the range of possible TM-mode wavelengths for the ternary and quaternary alloy active layers of the invention (at room temperature) to extend to 850 nm. The short-wavelength limit will be determined by the ability to obtain adequate electron confinement with AlGaAs or AlGaInP confining layers, or nearing the direct-indirect crossover. This short-wavelength limit is simply that of the GaInP ternary alloy system (along the left-hand axis of FIG. 3), or roughly 600 nm. The long-wavelength limit of the AlGaAsP system is about 850 nm, but its short wavelength limit is 650 nm, due to the indirect crossover.

From the foregoing, it will be clear that by using a tensile-strained GaAsP, InGaAsP or AlGaAsP active region, we can extend the range of TM-mode diode lasers from the 600-650 nm limits of the ternary, tensile-strained $Ga_zIn_{1-z}P$ [a>0.5]/[AlGa]$_{0.5}$In$_{0.5}$P QWs, out to about 850 nm. Furthermore, TE-mode lasers, fabricated from these same alloys, have already been demonstrated throughout this wavelength range. Therefore, using polarization switching techniques described in the earlier referenced related applications, one can construct monolithic arrays of TE- and TM-mode lasers, or polarization-switchable lasers, in the wavelength range of 600 nm to 850 nm.

The third referenced related application, whose contents are also incorporated herein by reference, describes the construction of diode lasers with an InGaAsN active layer for TM-polarized laser emission in the 850-1100 nm wavelength ranges, and also describes how this structure can be combined with other structures providing TE-polarized laser emission over the same range to produce switchable or controllable TE/TM lasers for that range. Those structures can be readily combined with the structures described in this and the other related applications to form, together, a description for making TE- and TM-mode laser diodes spanning the broad spectral range of 650-1100 nm.

It will be clear from the descriptions given above that the invention is not limited to the examples given. For example, while a GaAs substrate is preferred, other III–V substrate compositions, such as InP and GaSb, can be substituted. Similarly, other optical and carrier confining materials having comparable lattice constants and refractive indices can be substituted. It will also be evident that all of the conventional epitaxial growth techniques can be used, such as MO-VPE, MBE, and LPE, to manufacture the crystalline structures described herein. Similarly, the invention can be employed in other geometries besides the ridge waveguide illustrated, such as, for example, the gain-guided stripe or other forms of index guided waveguide, all as is well-known in this art.

Although there have been described what are at present considered to be the preferred embodiments of the invention, it will be understood that the invention may be embodied in other specific forms without departing from the essential characteristics thereof. The present embodiments are therefore to be considered in all respects as illustrative, and not restrictive. This scope of the invention is indicated by the appended claims rather than by the foregoing description.

What is claimed is:

1. A laser diode comprising:
   (a) a crystalline substrate of a III–V alloy having a first lattice constant and a first bandgap,
   (b) a crystalline active layer deposited over said substrate, said active layer comprising a III–V quaternary alloy such that said active layer has a second lattice constant smaller than said first lattice constant and a second bandgap when unstrained, said active layer when deposited over said substrate being tensile-strained such that said active layer has a third bandgap when strained that is smaller than the second bandgap,
   (c) electrodes for passing current through the active layer to thereby cause TM-polarized laser emission in said active layer at a wavelength exceeding 600 nm.

2. The laser diode of claim 1, wherein the substrate is GaAs.

3. The laser diode of claim 2, wherein the active layer comprises InGaAsP or AlGaAsP.

4. The laser diode of claim 3, wherein the active layer comprises $In_{1-x}Ga_xAs_yP_{1-y}$, where $0.52<x<1.0$ and $0<y<1$.

5. The laser diode of claim 4, wherein the active layer is flanked by confinement layers substantially lattice matched to the substrate and comprising AlGaAsP, AlGaAs or $(AlGa)_{0.52}In_{0.48}P$.

6. The laser diode of claim 3, wherein the active layer comprises $Al_{1-x}Ga_xAs_yP_{1-y}$, where $0.55<x<1$ and $0.55<y<1$.

7. The laser diode of claim 6, wherein the active layer is flanked by confinement layers substantially lattice matched to the substrate and comprising AlGaAsP, AlGaAs, or $(AlGa)_{0.52}In_{0.48}P$.

8. The diode of claim 3, wherein the diode emits in the range of 650-870 nm.

9. The diode of claim 1, wherein the light- and heavy-hole band edges in said quaternary layer are substantially aligned, and further comprising means for controlling the polarization of the oscillating mode in the active layer.

10. The diode of claim 9, where the means for controlling comprises means for modifying laser losses.

11. The diode of claim 9, wherein said alignment of the light-and heavy-hole band edges is produced through balancing the shift in bandgap energy due to said tensile straining of said active layer by an opposite shift in the bandgap energy due to a selected combination of thickness and composition for said active layer.

12. The diode of claim 1, wherein said active layer further comprises: plural Qws, one of said Qws providing TE-mode gain, the other of said QWs providing TM-mode gain.

13. The diode of claim 1, wherein said active layer comprises a QW producing a gain-current relationship wherein transparency current is lowest in one polarization mode and peak gain is highest in an orthogonal polarization mode.

14. The diode of claim 1, wherein the diode emits at a wavelength in the range of 620-870 nm.

15. A laser diode comprising:
   (a) a crystalline substrate of a III–V alloy having a first lattice constant and a first bandgap,
   (b) a crystalline active layer deposited over said substrate, said active layer comprising a GaAsP alloy such that said active layer has a second lattice constant smaller than said first lattice constant and a second bandgap when unstrained, said active layer when deposited over said substrate being tensile-strained such that said active layer has a third bandgap when strained that is smaller than the second bandgap, (c) electrodes for passing current through the active layer to thereby cause TM-polarized laser emission in said active layer at a wavelength exceeding 600 nm.

16. The laser diode of claim 15, wherein the substrate is GaAs.

17. The laser diode of claim 16, wherein the active layer is flanked by confinement layers substantially lattice matched to the substrate and comprising AlGaAs, AlGaAsP, or $(AlGa)_{0.5}In_{0.5}P$.

18. The diode of claim 15, wherein the light- and heavy-hole band edges in said active layer are substantially aligned, and further comprising means for controlling the polarization of the oscillating mode in the active layer.

19. The diode of claim 18, wherein said alignment of the light-and heavy-hole band edges is produced through substantially balancing the shift in bandgap energy due to said tensile straining of said active layer by an opposite shift in the bandgap energy due to a selected combination of thickness and in composition for said active layer.

20. The diode of claim 15, wherein said active layer further comprises: plural QWs, one of said QWs providing TE-mode gain, the other of said Qws providing TM-mode gain.

21. The diode of claim 15, wherein said active layer comprises a QW producing a gain-current relationship wherein transparency current is lowest in one polarization mode and peak gain is highest in an orthogonal polarization mode.

22. The diode of claim 15, wherein the diode emits at a wavelength in the range of 620–870 nm.

23. A polarization-switchable semiconductor laser, comprising:
(a) a semiconductor body having an active portion of a material exhibiting heavy hole and light hole band edges and capable of lasing and providing TE-mode polarized gain from heavy hole band transitions and TM-mode polarized gain from light hole band transitions,
(b) a QW laser structure in said active portion,
(c) electrodes for introducing carriers into the laser structure,
(d) optical reflectors associated with the laser structure,
(e) means connected to the laser structure for causing it selectively to lase in either its TE-mode or its TM-mode,
(f) the material of said active portion comprising a tensile-strained alloy of InGaAsP, AlGaAsP, or GaAsP.

24. The laser of claim 23, wherein said active portion has a single QW for which the heavy hole and light hole band edges substantially line up and the means for selectively causing it to lase comprises means for changing the threshold gain and current density.

25. A dual polarization, multi-beam emitting semiconductor QW laser, comprising:
(a) a semiconductor body having first and second side-by-side active portions of a material exhibiting heavy hole and light hole band edges and capable of lasing and providing TE-mode polarized gain from heavy hole band transitions and TM-mode polarized gain from light hole band transitions, said first and second active portions forming adjacent first and second QW laser structures emitting, respectively, in the TE-mode and TM-mode,
(b) electrode for introducing carriers into the active portions,
(c) optical reflectors associated with each laser structure,
(d) means connected to the adjacent laser structures for selectively activating same causing the first to lase in its TE-mode and the second to lase in its TM-mode,
(e) said active portions comprising a tensile-strained alloy of InGaAsP, AlGaAsP, or GaAsP.

26. The laser of claim 25, wherein the active portions comprise the same QW of the same alloy.

27. The laser of claim 25, wherein the active portions comprise different QWs.

* * * * *